(12) United States Patent
Chuang et al.

(10) Patent No.: US 10,418,282 B2
(45) Date of Patent: Sep. 17, 2019

(54) METHODS FOR FORMING THE ISOLATION STRUCTURE OF THE SEMICONDUCTOR DEVICE AND SEMICONDUCTOR DEVICES

(71) Applicant: Vanguard International Semiconductor Corporation, Hsinchu (TW)

(72) Inventors: Pi-Kuang Chuang, Hsinchu (TW); Ching-Yi Hsu, Hsinchu (TW); Po-Sheng Hu, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/975,168

(22) Filed: May 9, 2018

(65) Prior Publication Data

US 2018/0261509 A1    Sep. 13, 2018

Related U.S. Application Data

(62) Division of application No. 15/363,112, filed on Nov. 29, 2016, now Pat. No. 9,997,410.

(51) Int. Cl.
| | | |
|---|---|---|
| H01L 21/8234 | (2006.01) | |
| H01L 27/088 | (2006.01) | |
| H01L 21/762 | (2006.01) | |
| H01L 21/02 | (2006.01) | |

(52) U.S. Cl.
CPC ......... *H01L 21/823462* (2013.01); *H01L 21/02233* (2013.01); *H01L 21/76224* (2013.01); *H01L 27/088* (2013.01)

(58) Field of Classification Search
CPC ....... H01L 21/823462; H01L 21/02233; H01L 21/76224; H01L 27/088
See application file for complete search history.

(56) References Cited

U.S. PATENT DOCUMENTS

| | | |
|---|---|---|
| 6,239,003 B1 | 5/2001 | Rao et al. |
| 6,812,158 B1 | 11/2004 | Yeh et al. |
| 9,620,418 B2 | 4/2017 | Li et al. |
| 2002/0033516 A1 | 3/2002 | Choi et al. |
| 2002/0074614 A1 | 6/2002 | Furuta et al. |
| 2002/0111046 A1 | 8/2002 | Park et al. |
| 2002/0158284 A1 | 10/2002 | Kim |
| 2003/0022460 A1 | 1/2003 | Park |
| 2003/0104677 A1* | 6/2003 | Park .................. H01L 21/76224 438/424 |
| 2003/0109097 A1 | 6/2003 | Yamada et al. |

(Continued)

*Primary Examiner* — Nathan W Ha
(74) *Attorney, Agent, or Firm* — Birch, Stewart, Kolasch & Birch, LLP

(57) ABSTRACT

A method for forming an isolation structure of a semiconductor device is provided. The method includes forming a patterned dielectric structure in a first area and a second area of a substrate; forming a first isolation structure in the first area and forming a second isolation structure in the second area of the substrate; forming a cap layer over the first area and the second area of the substrate and performing an etching process to etch the cap layer of the second area completely; and performing an oxidation process on the second area to form a first oxide region over the second isolation structure and under the bottom surface of the patterned dielectric structure of the second area.

13 Claims, 13 Drawing Sheets

(56) References Cited

U.S. PATENT DOCUMENTS

| | | | |
|---|---|---|---|
| 2003/0143854 A1* | 7/2003 | Chen | H01L 21/02164 438/700 |
| 2003/0162364 A1* | 8/2003 | Lin | H01L 21/76224 438/424 |
| 2003/0181019 A1* | 9/2003 | Efferenn | H01L 21/76224 438/424 |
| 2003/0194874 A1* | 10/2003 | Ouchi | H01L 21/31116 438/710 |
| 2004/0029398 A1 | 2/2004 | Lee et al. | |
| 2004/0147099 A1 | 7/2004 | Hashimoto et al. | |
| 2007/0290271 A1 | 12/2007 | Kusakabe | |
| 2008/0160768 A1 | 7/2008 | Ni et al. | |
| 2009/0236681 A1 | 9/2009 | Lin et al. | |
| 2014/0319622 A1 | 10/2014 | Chen et al. | |
| 2016/0133524 A1* | 5/2016 | Li | H01L 21/823462 438/275 |

\* cited by examiner

METHODS FOR FORMING THE ISOLATION STRUCTURE OF THE SEMICONDUCTOR DEVICE AND SEMICONDUCTOR DEVICES

CROSS-REFERENCE TO RELATED APPLICATIONS

This application is a Divisional of U.S. patent application Ser. No. 15/363,112 filed on Nov. 29, 2016, the entire contents of which is hereby expressly incorporated into the present application.

BACKGROUND OF THE INVENTION

Field of the Invention

The present invention relates to semiconductor devices, and in particular to methods for forming the isolation structure of the semiconductor device.

Description of the Related Art

High-voltage semiconductor devices are applied to integrated circuits with high voltage and high power. Traditional high-voltage semiconductor devices, for example a vertically diffused metal oxide semiconductor (VDMOS) or a laterally diffused metal oxide semiconductor (LDMOS), are mainly used for devices with at least 18 volts or higher. The advantages of high-voltage device technology include cost effectiveness and process compatibility. High-voltage device technology has been widely used in display driver IC devices and power supply devices, and in the fields of power management, communications, automation, industrial control, etc.

Although semiconductor devices that currently exist are sufficient to meet their original intended use, they are not satisfactory in all respects. Therefore, we still need to sustain our efforts.

BRIEF SUMMARY OF THE INVENTION

The disclosure provides a method for forming an isolation structure of a semiconductor device. The method includes forming a patterned dielectric structure in a first area and a second area of a substrate. The method includes forming a first isolation structure in the first area and forming a second isolation structure in the second area of the substrate, wherein a surface formed of a sidewall of the first isolation structure and a bottom surface of the patterned dielectric structure of the first area has a first curvature, and a surface formed of a sidewall of the second isolation structure and a bottom surface of the patterned dielectric structure of the second area has the first curvature. The method also includes forming a cap layer over the first area and the second area of the substrate and performing an etching process to etch the cap layer of the second area completely. The method further includes performing an oxidation process on the second area to form a first oxide region over the sidewall of the second isolation structure and under the bottom surface of the patterned dielectric structure of the second area, and a surface of the first oxide region adjacent to the substrate has a second curvature.

The disclosure provides a semiconductor device. The semiconductor device includes a substrate having a first area and a second area and a gate oxide layer disposed over the first area and the second area of the substrate. The semiconductor device includes a first isolation structure disposed in the substrate of the first area and a second isolation structure disposed in the substrate of the second area, wherein a surface formed of a bottom surface of the gate oxide layer and a sidewall of the first isolation structure has a first curvature. The semiconductor device also includes a first oxide region disposed under the gate oxide layer of the second area and over a sidewall of the second isolation structure, wherein a surface of the first oxide region adjacent to the substrate has a second curvature that is different than the first curvature. The semiconductor device further includes a gate electrode disposed over the gate oxide layer.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
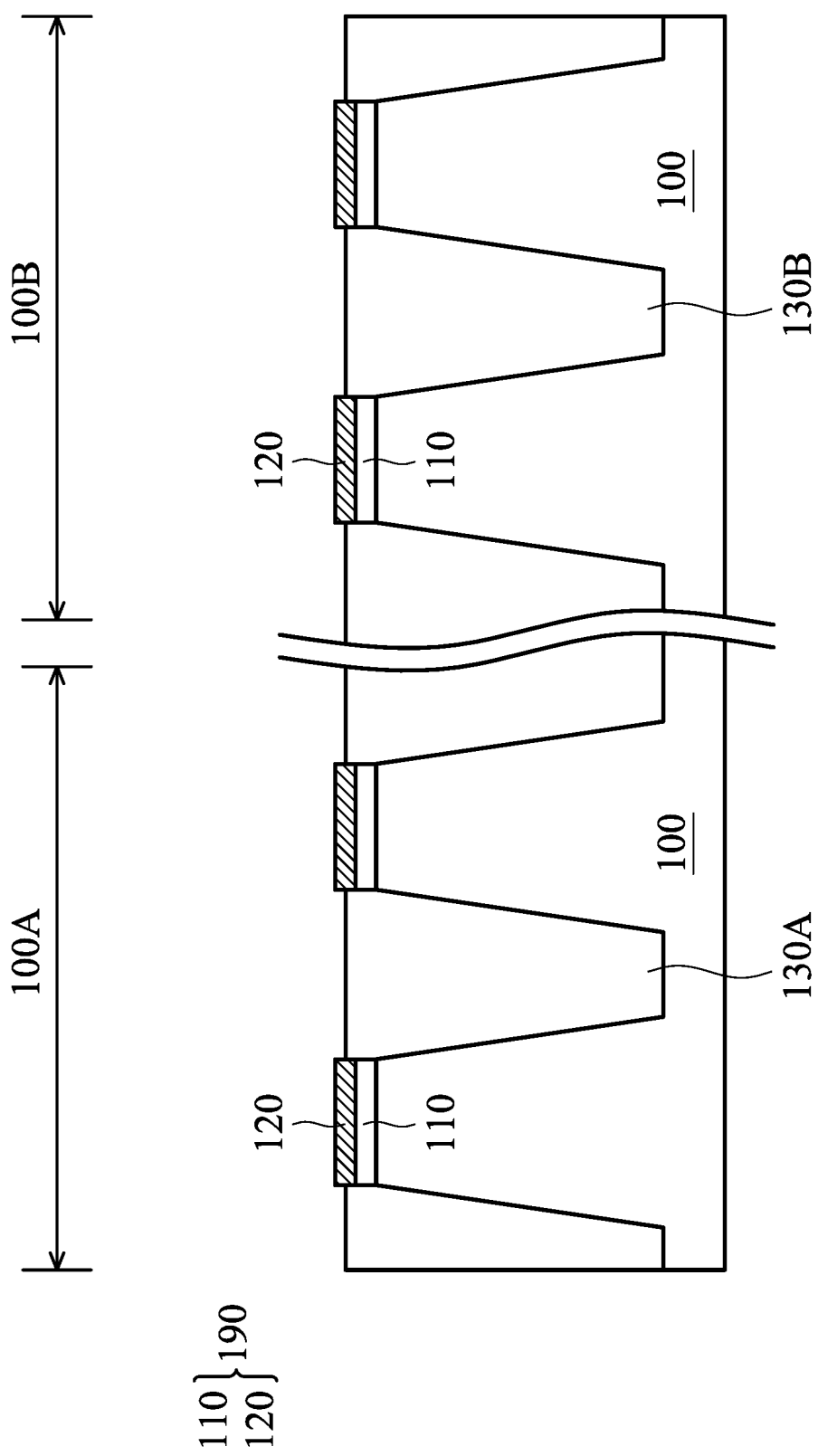
FIGS. 1A to 1F are cross-sectional representations of various stages of forming a semiconductor device in accordance with some embodiments.

The following disclosure provides many different embodiments, or examples, for implementing different elements of the invention. Specific examples of components and arrangements are described below to simplify the present disclosure. These are, of course, merely examples and are not intended to be limiting. For example, the formation of a first element over or on a second element in the description that follows may include embodiments in which the first and second elements are formed in direct contact, and may also include embodiments in which additional elements may be formed between the first and second elements, such that the first and second elements may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1F are cross-sectional views of various stages of a process for forming a semiconductor device 10, in accordance with some embodiments. Additional operations can be provided before, during, and/or after the stages described in FIGS. 1A-1F. Some of the stages that are described can be replaced or eliminated for different embodiments. Additional features can be added to the semiconductor device 10. Some of the features described below can be replaced or eliminated for different embodiments.

As shown in FIG. 1A, a substrate 100 is provided, in accordance with some embodiments. The substrate 100 includes a semiconductor wafer (such as a silicon wafer) or a portion of a semiconductor wafer. In some embodiments, the substrate 100 is made of an elementary semiconductor material including silicon or germanium in a single crystal, polycrystal, or amorphous structure.

In some other embodiments, the substrate 100 is made of a compound semiconductor, such as silicon carbide, gallium arsenide, gallium phosphide, indium phosphide, indium arsenide, an alloy semiconductor, such as SiGe, or GaAsP, or a combination thereof. The substrate 100 may also include multi-layer semiconductors, semiconductor on insulator (SOI) (such as silicon on insulator or germanium on insulator), or a combination thereof.

As shown in FIG. 1A, the substrate 100 includes a first area 100A and a second area 100B. In some embodiments, the first area 100A is a low-voltage area, and the second area 100B is a high-voltage area.

The substrate 100 includes a patterned isolation structure 190, as shown in FIG. 1A, the patterned isolation structure 190 includes a first dielectric layer 120 and a second dielectric layer 110 formed under the first dielectric layer 120. The second dielectric layer 110 and the first dielectric layer 120 may be formed by a chemical vapor deposition (CVD) process, a physical vapor deposition (PVD) process, an oxidation process, or another applicable process. In some embodiments, the first dielectric layer 120 is formed by depositing a dielectric material (not shown). Next, the dielectric material is patterned by a lithography process, and then removed by an etching process. In some embodiments, the etching processes include dry etching, wet etching, or another etching method (e.g., reactive ion etching). The etching process is also either purely chemical etching, purely physical etching, or a combination thereof.

The material of the second dielectric layer 110 and the first dielectric layer 120 may include silicon oxide, silicon nitride, silicon oxynitride, fluoride-doped silicate glass (FSG), low-K dielectric material, other suitable materials, or a combination thereof. The material of the first dielectric layer 120 may be the same as or different than the material of second dielectric layer 110. In some embodiments, the second dielectric layer 110 is made of silicon oxide, and the first dielectric layer 120 is made of silicon nitride.

After the second dielectric layer 110 and the first dielectric layer 120 are formed, an etching process is performed. The first dielectric layer 120 and the second dielectric layer 110 are used as a mask, and then a portion of the substrate 100 uncovered by the second dielectric layer 110 and the first dielectric layer 120 is removed to form a trench. Subsequently, the dielectric material is deposited in the trench. Next, the excess dielectric material is removed to form a first isolation structure 130A and a second isolation structure 130B. The deposition of the dielectric material may be formed by a CVD process, a PVD process, or another applicable process. In some embodiments, the excess dielectric material is removed by chemical mechanical polish (CMP) process. The material of the first isolation structure 130A is the same as that of the second isolation structure 130B. The material of the first isolation structure 130A and the second isolation structure 130B may include silicon oxide, silicon nitride, silicon oxynitride, fluoride-doped silicate glass, low-K dielectric material, other suitable materials, or a combination thereof. In some embodiments, the first isolation structure 130A and the second isolation structure 130B are made of silicon oxide. As shown in FIG. 1A, the first isolation structure 130A is formed in the first area 100A of the substrate 100, and the second isolation structure 130B is formed in the second area 100B of the substrate 100.

Figure 1B:
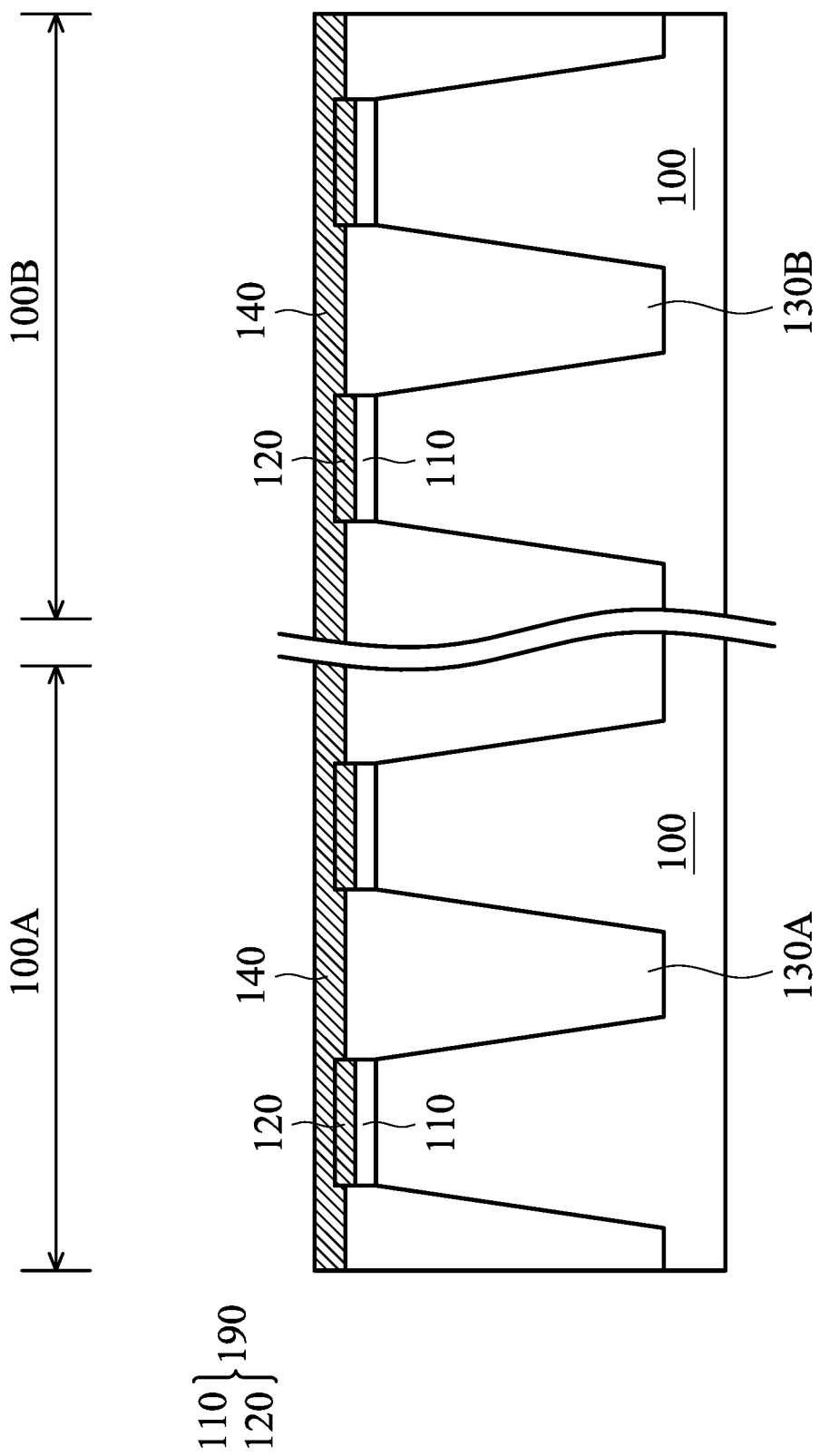

In some embodiments, as shown in FIG. 1B, after the first isolation structure 130A and the second isolation structure 130B are formed, a cap layer 140 is deposited over the first area 100A and the second area 100B of the substrate 100 to cover the first isolation structure 130A and the second isolation structure 130B. The cap layer 140 may be formed by a CVD process, a PVD process, or another applicable process. The material of the cap layer 140 may include silicon oxide, silicon nitride, silicon oxynitride, fluoride-doped silicate glass, low-K dielectric material, another suitable material, or a combination thereof. In some embodiments, the cap layer 140 is made of silicon nitride.

In some embodiments, the thickness of the cap layer 140 is in a range between 100 Å to 500 Å. If the cap layer 140 is not thick enough, then it can't avoid oxygen reacting with the substrate 100 to form an oxide region under the patterned isolation structure 190 in the subsequent oxidation process. On the other hand, if the cap layer 140 is too thick, then it becomes difficult to remove the cap layer 140 in the subsequent process.

Figure 1C:
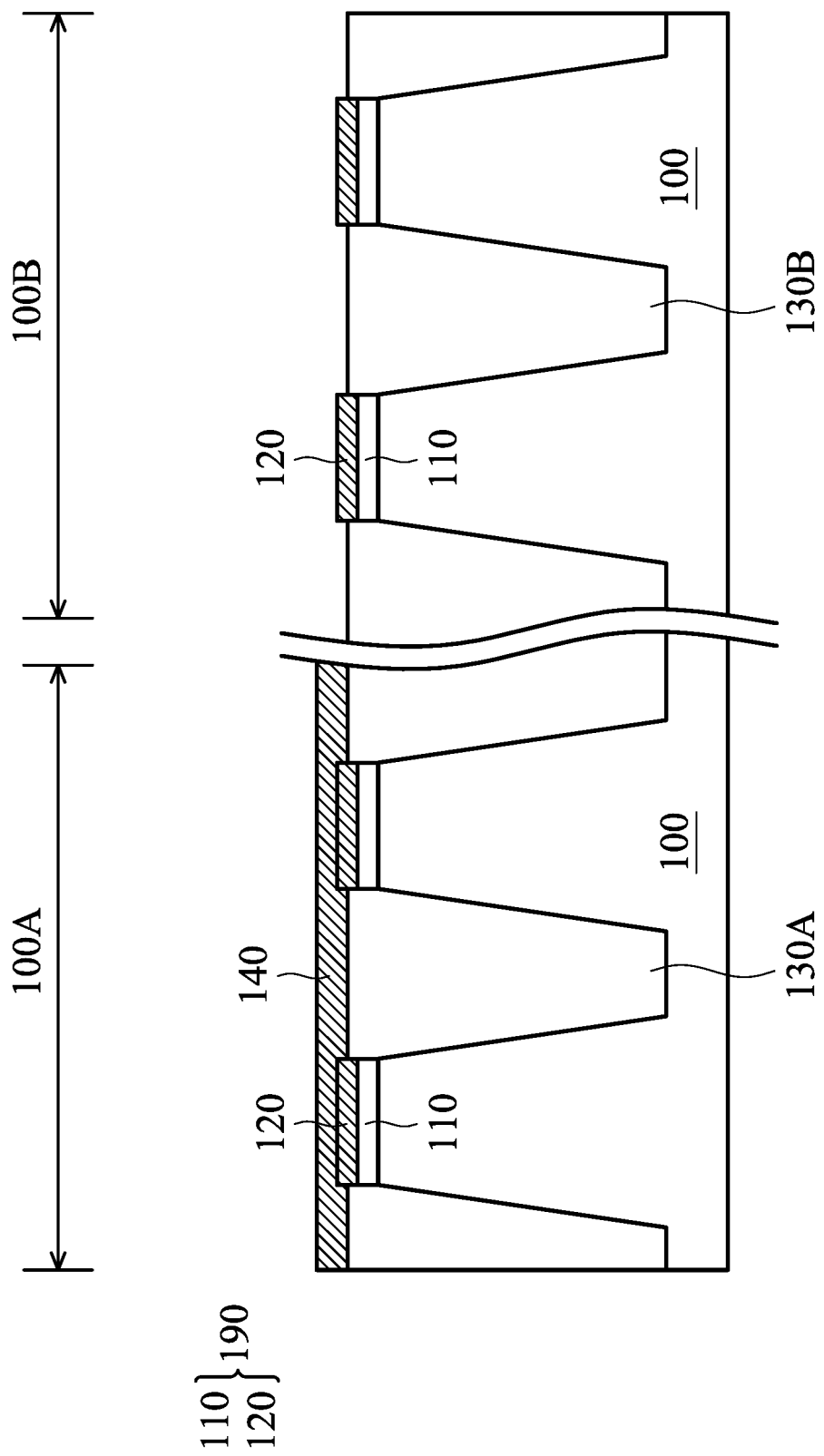

In some embodiments, as shown in FIG. 1C, after the cap layer 140 is formed, the cap layer 140 of the second area 100B is removed to expose the first dielectric layer 120 of the second area 100B and a top surface of the second isolation structure 130B. The cap layer 140 of the first area 100A is not removed. In some embodiments, the cap layer 140 of the second area 100B is removed by a lithography process and an anisotropic etching process.

Figure 1D:
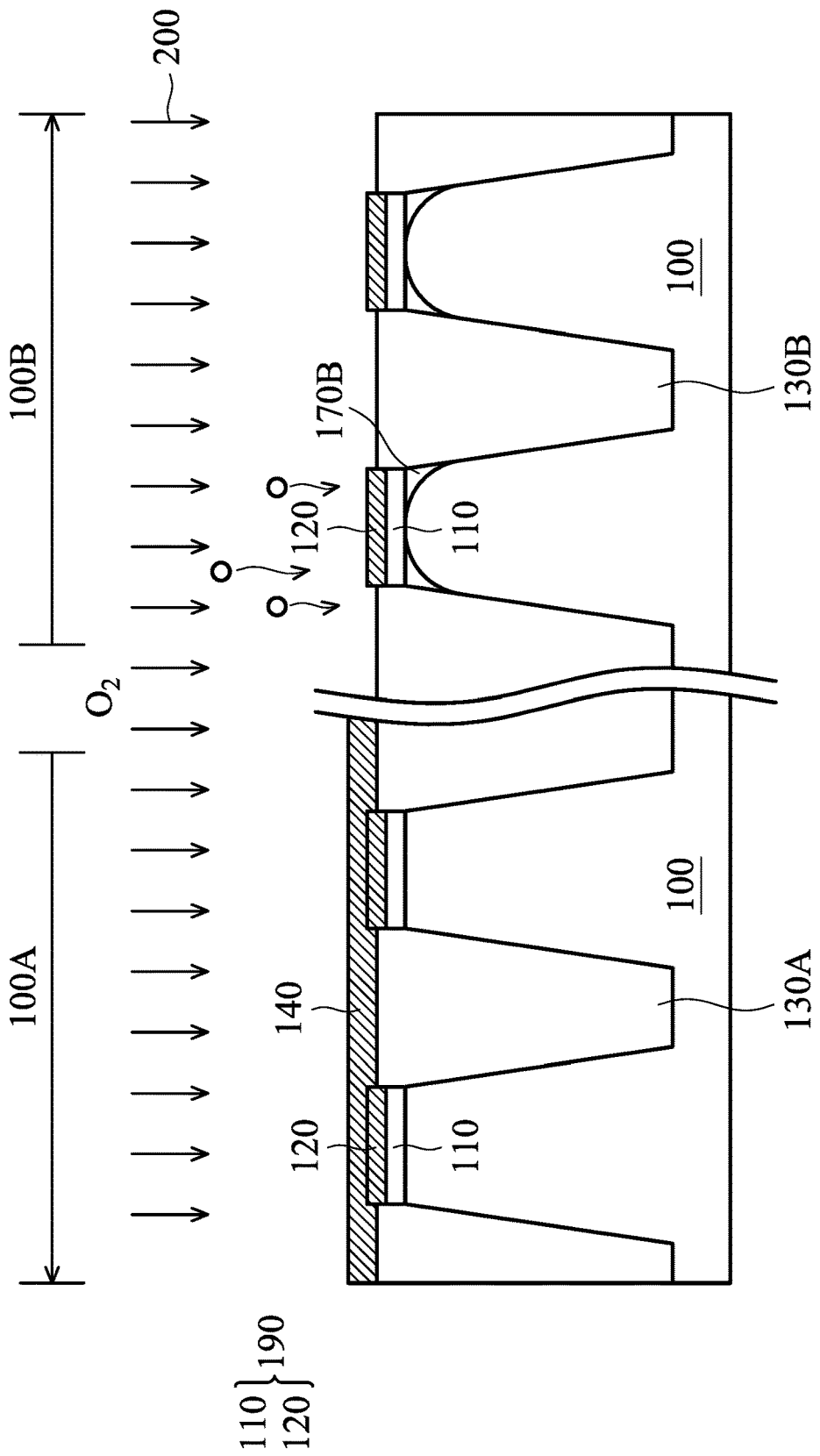

In some embodiments, as shown in FIG. 1D, an oxidation process 200 is performed on the second isolation structure 130B after the cap layer 140 of the second area 100B is removed. In some embodiments, the oxidation process 200 is performed by injecting oxygen in a temperature between 600° C. to 1000° C. As shown in FIG. 1D, oxygen penetrates the border between the substrate 100, the second isolation structure 130B and the second dielectric layer 110 through the second isolation structure 130B. Next, oxygen reacts with the substrate 100 to form a first oxide region 170B. More specifically, the first oxide region 170B is formed under the second dielectric layer 110 of the second area 100B and over a sidewall of the second isolation structure 130B. Since the first area 100A of the substrate 100 is covered by the cap layer 140, oxygen can't penetrate to a border between the substrate 100, the first isolation structure 130A and the second dielectric layer 110 through the cap layer 140. More specifically, oxygen can't react with the substrate 100 of the first region 110A. Therefore, after the oxidation process 200 is performed, the first oxide region 170B is formed in the second area 100B, and no additional oxide region is formed in the first area 100A.

Since the first oxide region 170B is insulating, the combination of the first oxide region 170B and the second isolation structure 130B may be regarded as an isolation element of the second area 100B. The profile of the isolation element in the second area 100B is changed by the formation of the first oxide region 170B.

As shown in FIG. 1D, the border between the first isolation structure 130A, the substrate 100 and the second dielectric layer 110 has a first curvature. Namely, a surface formed of a sidewall of the first isolation structure 130A and a bottom surface of the patterned isolation structure 190 of the first area 100A has the first curvature, and a surface of the first oxide region 170B adjacent to the substrate 100 has a second curvature. After the oxidation process 200 is performed, due to the first oxide region 170B being formed at the border between the second isolation structure 130B, substrate 100 and the second dielectric layer 110, the border becomes smoother. Therefore, the second curvature is smaller than the first curvature.

Figure 1E:
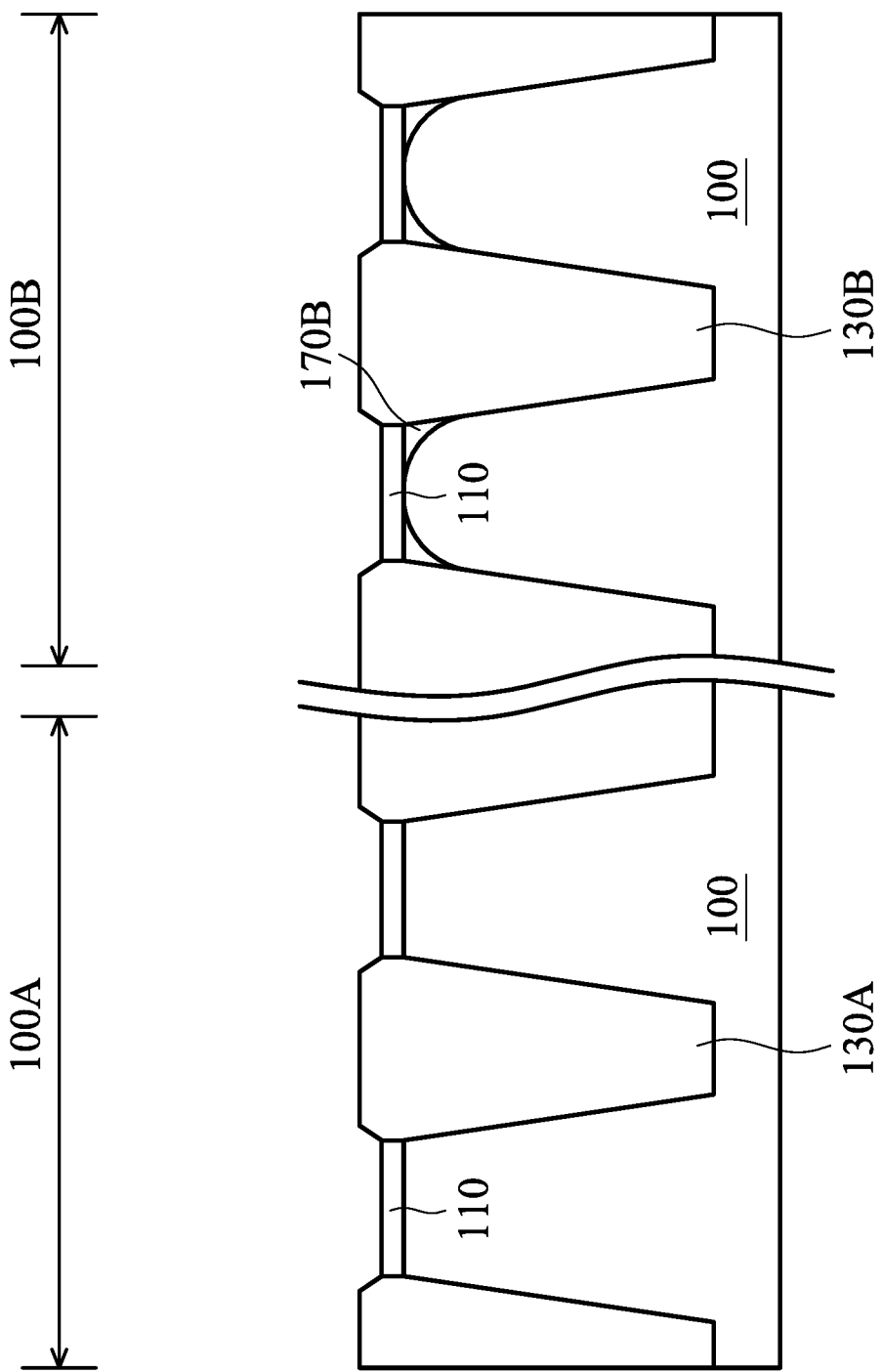

In some embodiments, as shown in FIG. 1E, the cap layer 140 and the first dielectric layer 120 are removed after the oxidation process 200 is performed. In some embodiments, the cap layer 140 and the first dielectric layer 120 are removed by performing an anisotropic etching process.

Figure 1F:
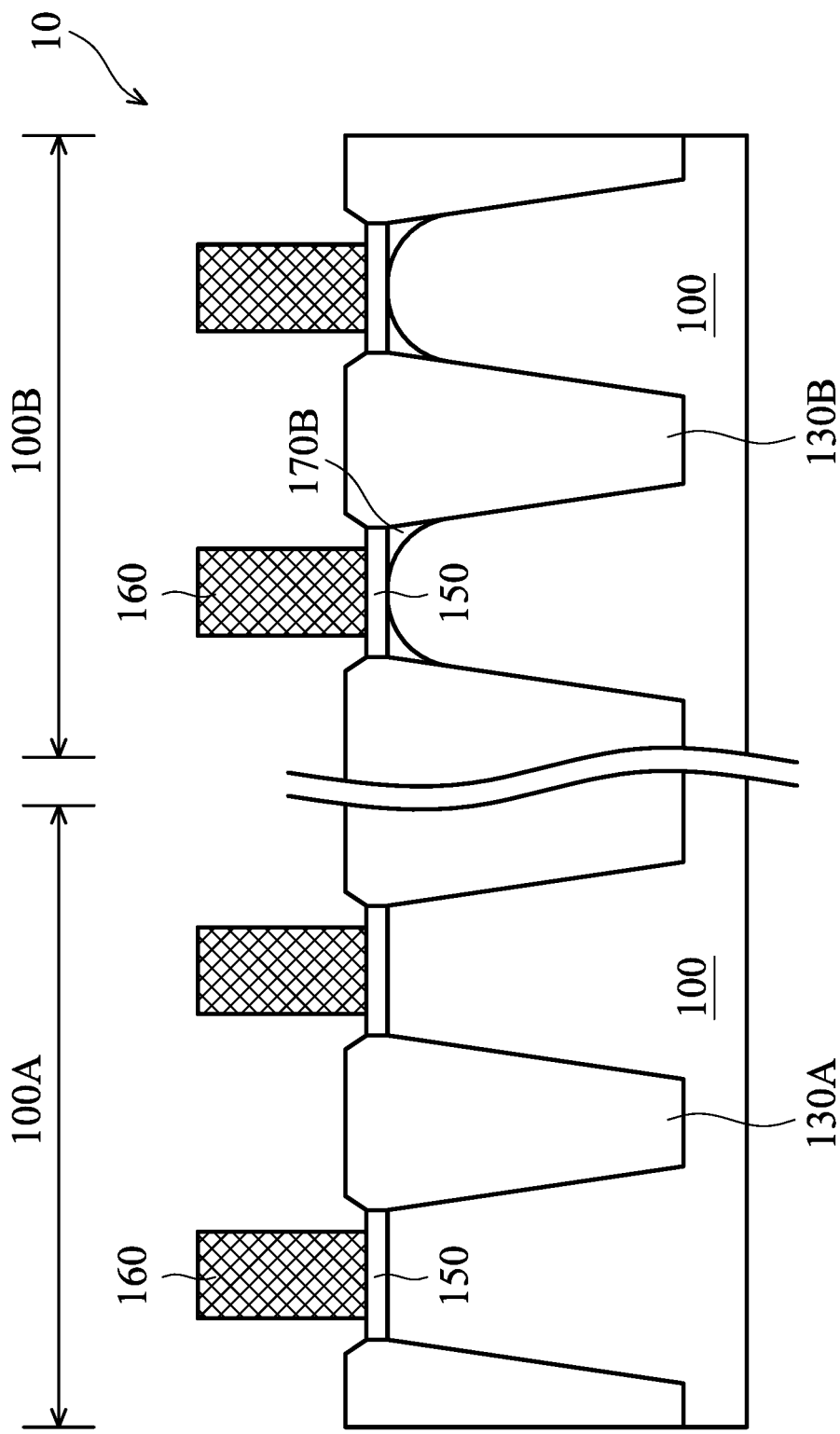

In some embodiments, as shown in FIG. 1F, the second dielectric layer 110 is removed after the cap layer 140 and the first dielectric layer 120 are removed, and a gate oxide layer 150 is formed in two opposite sides of the first isolation structure 130A and two opposite sides of the second isolation structure 130B. The second dielectric layer 110 may be removed by dry etching, wet etching and other etching methods. A gate electrode layer 160 is formed over the gate oxide layer 150 after the gate oxide layer 150 is formed, and a semiconductor device 10 is completed. The material of the gate electrode layer 160 includes polysilicon or other applicable materials.

In this embodiment, due to the isolation element of the second area 100B (such as high-voltage area) of the semiconductor device 10 has a smaller second curvature, the gate oxide thinning ratio become better. Therefore, the gate oxide integrity (GOI) of the gate oxide layer 150 is improved such that the electronic qualities of the second area 100B (such as high-voltage area) of the semiconductor device 10 are also improved.

However, if the curvature (e.g. the first curvature) of a surface formed of an isolation element (e.g. the first isolation structure 130A) of the first area 100A adjacent to the substrate 100 becomes smaller, the saturated drain current (Idsat) of the first area 100A (e.g. low-voltage area) of the semiconductor device 10 will be impacted. In this embodiment of the disclosure, the cap layer 140 is deposited over the first area 100A (e.g. low-voltage area) of the semiconductor device 10 before the oxidation process 200 is performed, and thus oxygen doesn't react with the substrate 100 to form oxide. Therefore, the profile of the isolation element of the first area 100A doesn't change. After the first isolation structure 130A is covered by the cap layer 140, the oxidation process 200 is subsequently performed so that the curvature (e.g. the second curvature) of the surface formed of an isolation element (e.g. the second isolation structure 130B and the first oxide region 170B) of the second area 100B adjacent to the substrate 100 becomes smaller, and the curvature of the first area 100A is not impacted. Accordingly, the GOI of the high-voltage area of the semiconductor device 10 is improved and the electronic quality of the low-voltage area of the semiconductor device 10 is not impacted.

Some embodiments of the disclosure are described. FIGS. 2A-2F are cross-sectional views of various stages of a process for forming a semiconductor device 20, in accordance with some embodiments. Additional operations can be provided before, during, and/or after the stages described in FIGS. 2A-2F. Some of the stages that are described can be replaced or eliminated for different embodiments. Additional features can be added to the semiconductor device 20. Some of the features described below can be replaced or eliminated for different embodiments.

Figure 2A:
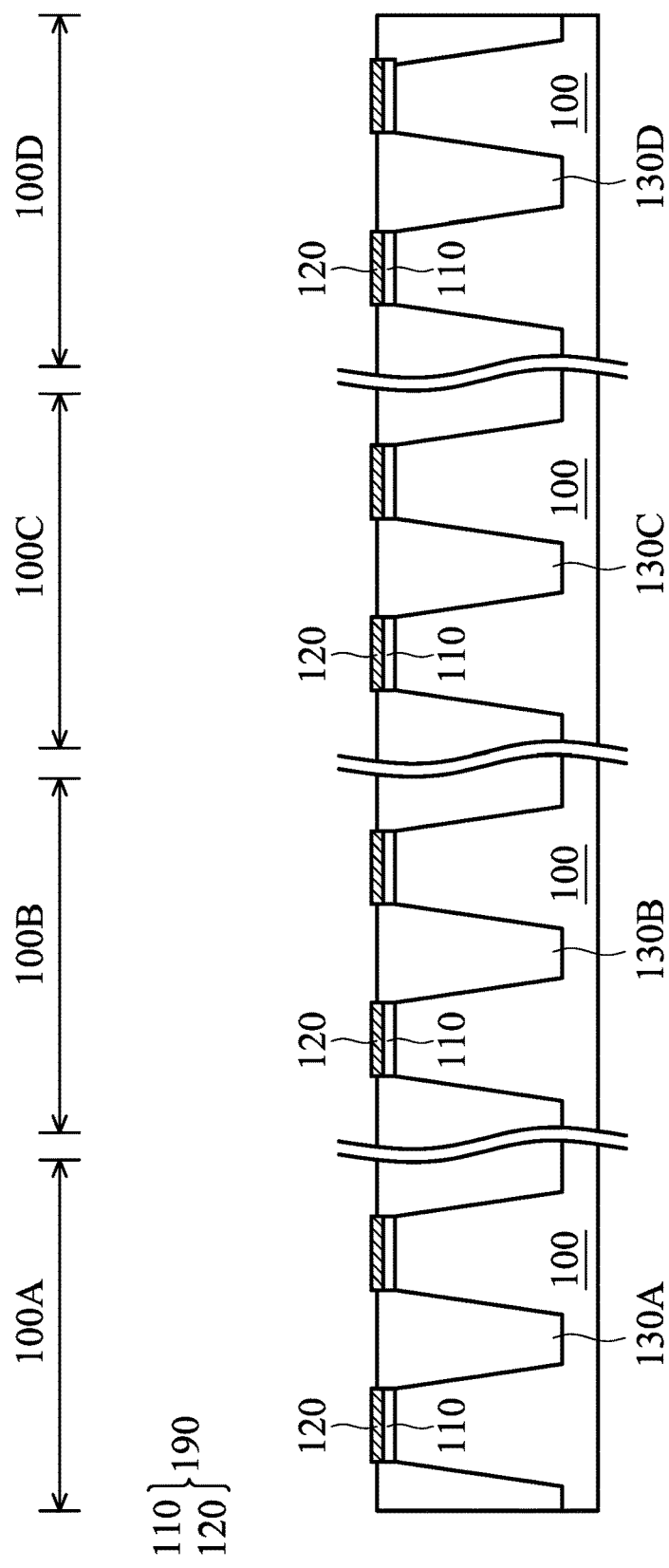
FIGS. 2A to 2F are cross-sectional representations of various stages of forming a semiconductor device in accordance with some embodiments.

As shown in FIG. 2A, the substrate 100 includes the first area 100, the second area 100B, a third area 100C and a fourth area 100D. In some embodiments, the first area 100A is a low-voltage area. The second area 100B, third area 100C and the fourth area 100D are high-voltage areas.

As shown in FIG. 2A, the substrate 100 further includes the third isolation structure 130C and the fourth isolation structure 130D. The processes and materials used to form the third isolation structure 130C and the fourth isolation structure 130D may be similar to, or the same as, those used to form the first isolation structure 130A and the second isolation structure 130B described above and are not repeated herein. As shown in FIG. 2A, the third isolation structure 130C is formed in the third area 100C of the substrate 100, and the fourth isolation structure 130D is formed in the fourth area 100D of the substrate 100.

Figure 2B:
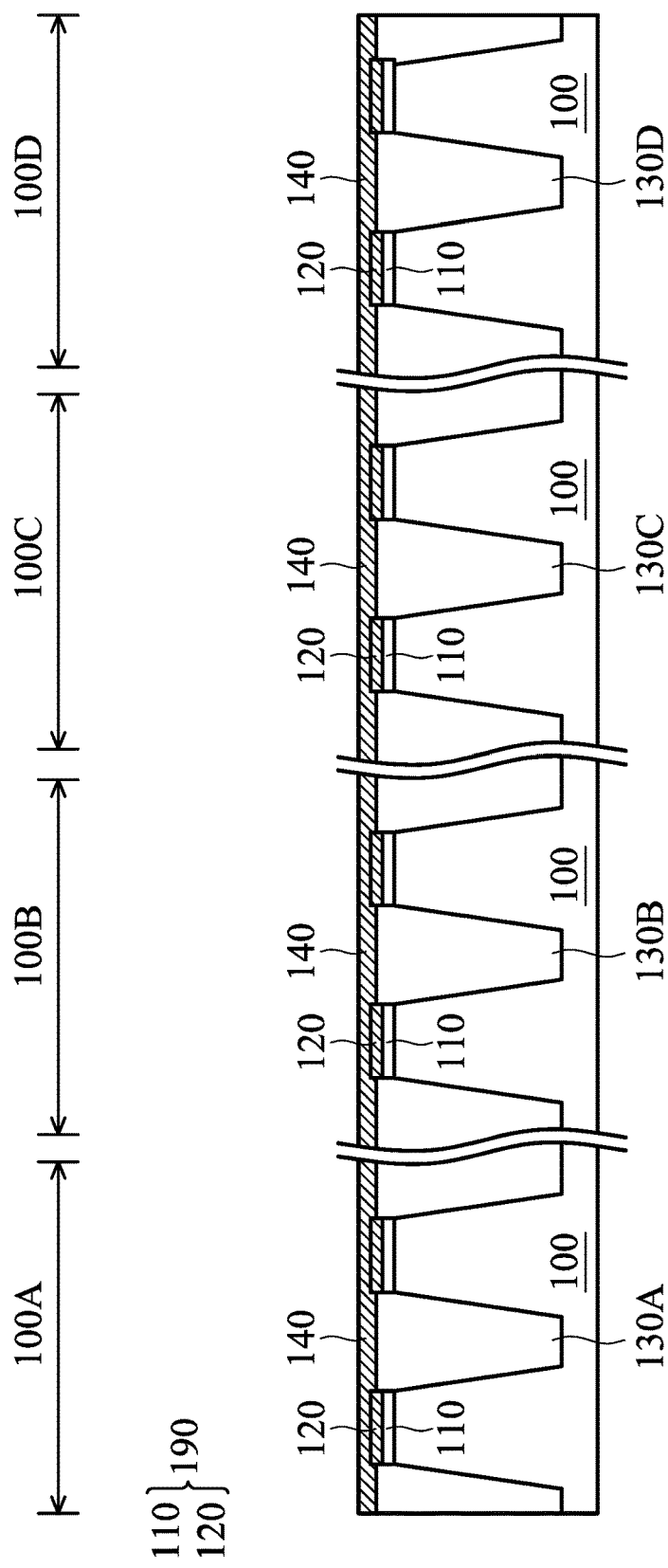

As shown in FIG. 2B, after the first isolation structure 130A, the second isolation structure 130B, the third isolation structure 130C and the fourth isolation structure 130D are formed, the cap layer 140 is deposited over the first area 100A, the second area 100B, the third area 100C and the fourth area 100D of the substrate 100 to cover the first isolation structure 130A, the second isolation structure 130B, the third isolation structure 130C and the fourth isolation structure 130D. In some embodiments, the thickness of the cap layer 140 is in a range between 100 Å to 500 Å. If the cap layer 140 is not thick enough, then it can't avoid oxygen reacting with the substrate 100 to form an oxide region under the patterned isolation structure 190 in the subsequent oxidation process. On the other hand, if the cap layer 140 is too thick, then it becomes difficult to remove the cap layer 140 in the subsequent process.

Figure 2C:
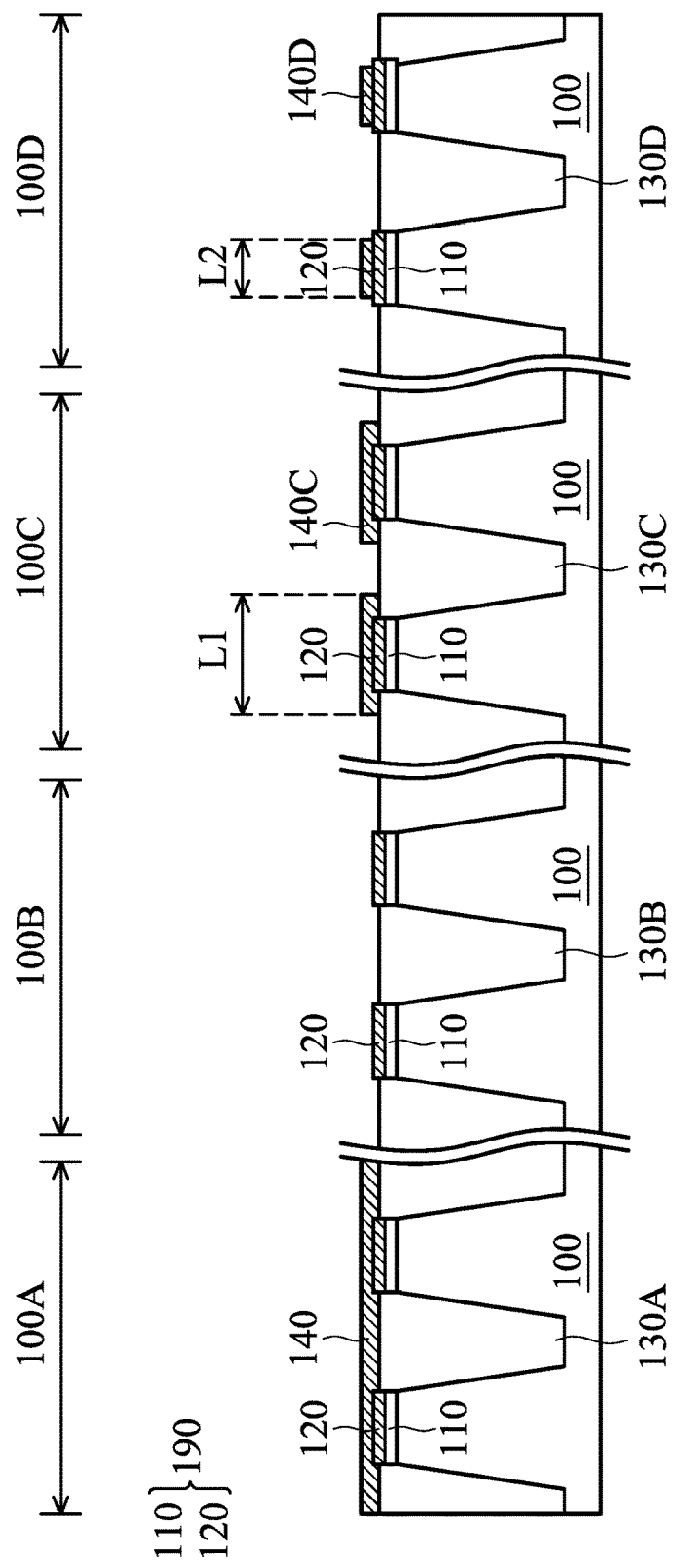

In some embodiments, as shown in FIG. 2C, after the cap layer 140 is formed, the cap layer 140 of the second area 100B is removed completely to expose the first dielectric layer 120 and the top surface of the second isolation structure 130B. A portion of the cap layer 140 of the third area 100C and a portion of the cap layer 140 of the fourth area 100D are also removed. As shown in FIG. 2C, after the portion of the cap layer 140 in the third area 100C is removed, a first remaining portion 140C is formed. After the portion of the cap layer 140 in the fourth area 100D is removed, a second remaining portion 140D is formed.

In some embodiments, as shown in FIG. 2C, along the horizontal direction, the length L1 of the first remaining portion 140C is greater than the length L2 of the second remaining portion 140D. The first remaining portion 140C is formed over the first dielectric layer 120 of the third area 100C, and the first remaining portion 140C extends from a top surface of the first dielectric layer 120 to a top surface of the third isolation structure 130C. The second remaining portion 140D is formed over the first dielectric layer 120 of the fourth area 100D, and the first dielectric layer 120 of the fourth area 100D is not covered completely by the second remaining portion 140D. Namely, a portion of the first dielectric layer 120 of the fourth area 100D is exposed.

In some embodiments, there are different remaining portions of the cap layer 140 in the first area 100A, the second area 100B, the third area 100C and the fourth area 100D, respectively. A patterned mask having four layouts is disposed on the cap layer 140, and an anisotropic etching process is performed to remove the cap layer 140 of the second area 100B completely. The first remaining portion 140C is formed in the third area 100C and the second remaining portion 140D is formed in the fourth area 100D, and the cap layer 140 of the first area 100A remains.

As shown in FIG. 2C, after the etching process is performed on the cap layer 140, the cap layer 140 of the third area 100C and the cap layer 140 of the fourth area 100D have different lengths over the first dielectric layer 120. The cap layer 140 of the first area 100A is not removed, and the cap layer 140 of the second area 100B is removed completely. The cap layer 140 of the third area 100C forms the first remaining portion 140C, and the first remaining portion 140C extends from the top surface of the first dielectric layer 120 to the top surface of the third isolation structure 130C. The cap layer 140 of the fourth area 100D forms the second remaining portion 140D, and the first dielectric layer 120 of the fourth area 100D is not covered completely by the second remaining portion 140D.

Figure 2D:
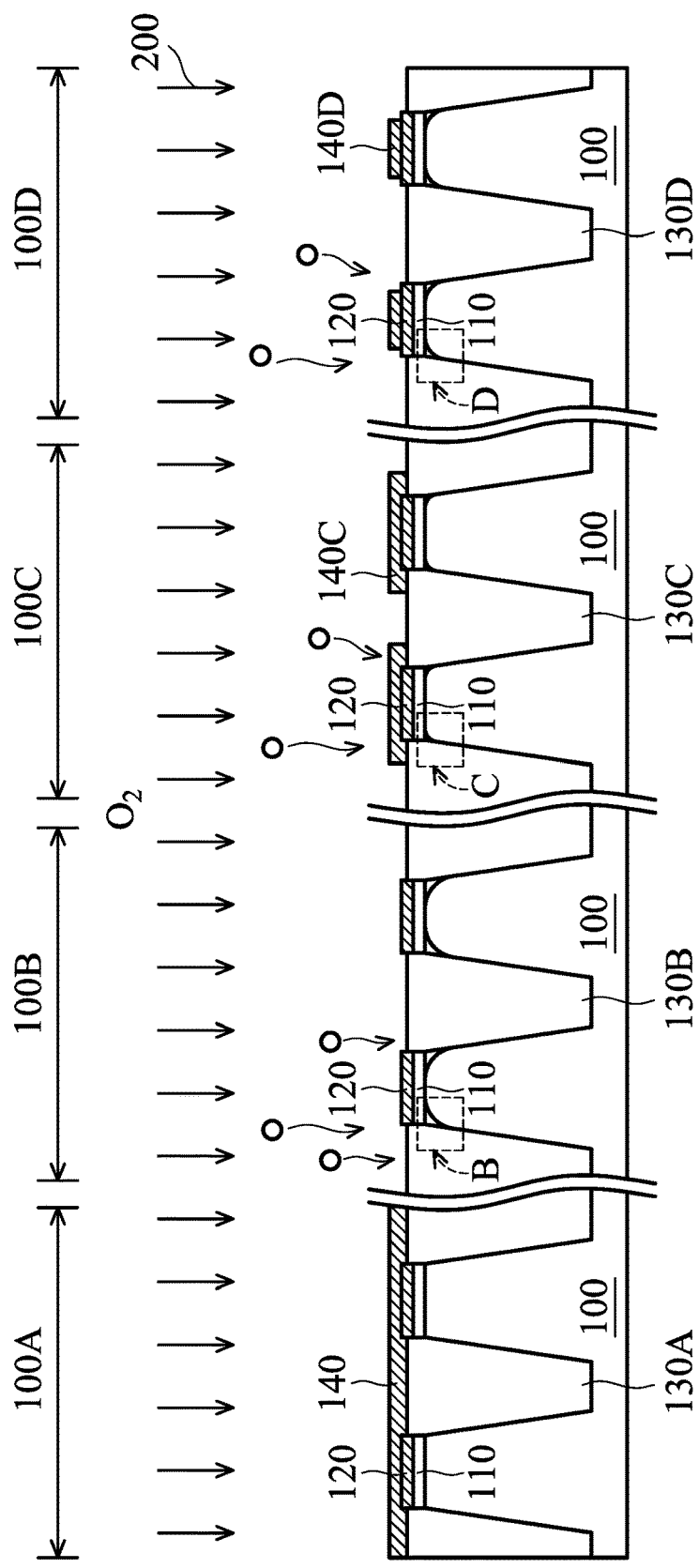

In some embodiments, as shown in FIG. 2D, the oxidation process 200 is performed on the second isolation structure 130B, the third isolation structure 130C and the fourth isolation structure 130D. In some embodiments, the oxidation process 200 is performed by injecting oxygen at a temperature between 800° C. to 1200° C. As shown in FIG. 2D, oxygen reacts with the substrate 100 of the second area 100B, the third area 100C and the fourth area 100D to form the first oxide region, the second oxide region and the third oxide region, respectively (the first oxide region, the second oxide region and the third oxide region are shown in FIGS. 3A-3C).

Figure 3A:
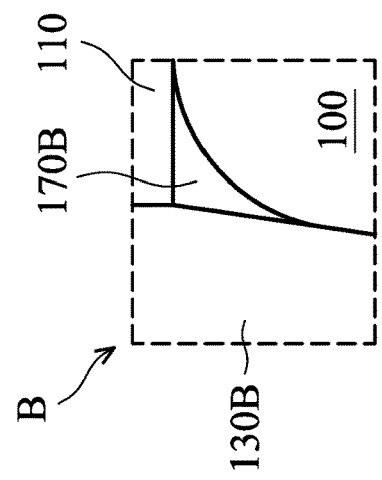
FIG. 3A is an enlarged view of region B in FIG. 2D in accordance with some embodiments.
Figure 3B:
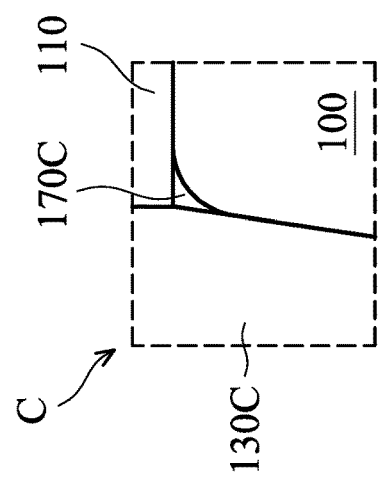
FIG. 3B is an enlarged view of region C in FIG. 2D in accordance with some embodiments.
Figure 3C:
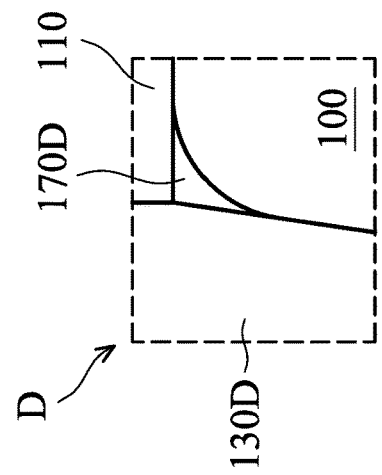
FIG. 3C is an enlarged view of region D in FIG. 2D in accordance with some embodiments.

Referring to FIGS. 3A-3C, FIGS. 3A-3C are enlarged views of the regions B, C and D shown in FIG. 2D in accordance with some embodiments. As shown in FIGS. 3A-3C, the first oxide region 170B is formed under the second dielectric layer 110 of the second area 100B and over the sidewall of the second isolation structure 130B, the second oxide region 170C is formed under the second dielectric layer 110 of the third area 100C and over a sidewall of the third isolation structure 130C, and the third oxide region 170D is formed under the second dielectric layer 110 of the fourth area 100D and over a sidewall of the fourth isolation structure 130D. The first oxide region 170B, the second oxide region 170C and the third oxide region 170D are insulating. Therefore, The profiles of the isolation elements in the second area 100B (the second isolation structure 130B and the first oxide region 170B), in the third area 100C (the third isolation structure 130C and the second oxide region 170C) and in the fourth area 100D (the fourth isolation structure 130D and the third oxide region 170D) are changed by the formation of the first oxide region 170B, the second oxide region 170C and the third oxide region 170D.

As shown in FIGS. 3A-3C, the surface of the second oxide region 170C formed over the sidewall of the third isolation structure 130C and under the second dielectric layer 110 adjacent to the substrate 100 has a third curvature, and a surface of the third oxide region 170D formed over the sidewall of the fourth isolation structure 130D and under the second dielectric layer 110 adjacent to the substrate 100 has a fourth curvature. Due to the length L1 of the first remaining portion 140C is greater than the length L2 of the second remaining portion 140D, it's more difficult for oxygen to react with the substrate 100 in the third isolation structure 130C. Therefore, the third curvature is greater than the fourth curvature. Namely, the surface of the third oxide region 170D adjacent to the substrate 100 is smoother than the surface of the second oxide region 170C adjacent to the substrate 100.

As mentioned above, the cap layer 140 in the first area 100A is not removed, and thus there is no additional oxide region formed in the first area 100A.

Since the cap layer 140 in the first area 100A, the second area 100B, the third area 100C and the fourth area 100D have different respective lengths, the profiles of the isolation element in the first area 100A (e.g. the first isolation structure 130A), the isolation element in the second area 100B (e.g. the second isolation structure 130B and the first oxide region 170B), the isolation element in the third area 100C (e.g. the third isolation structure 130C and the second oxide region 170C) and the isolation element in the fourth area 100D (e.g. the fourth isolation structure 130D and the third oxide region 170D) are different. The first curvature is greater than the third curvature, the third curvature is greater than the fourth curvature, and the fourth curvature is greater than the second curvature.

Furthermore, as shown in FIGS. 3A-3C, an area of the first oxide region 170B is greater than an area of the third oxide region 170D, and the area of the third oxide region 170D is greater than an area of the second oxide region 170C in the cross-sectional views.

Figure 2E:
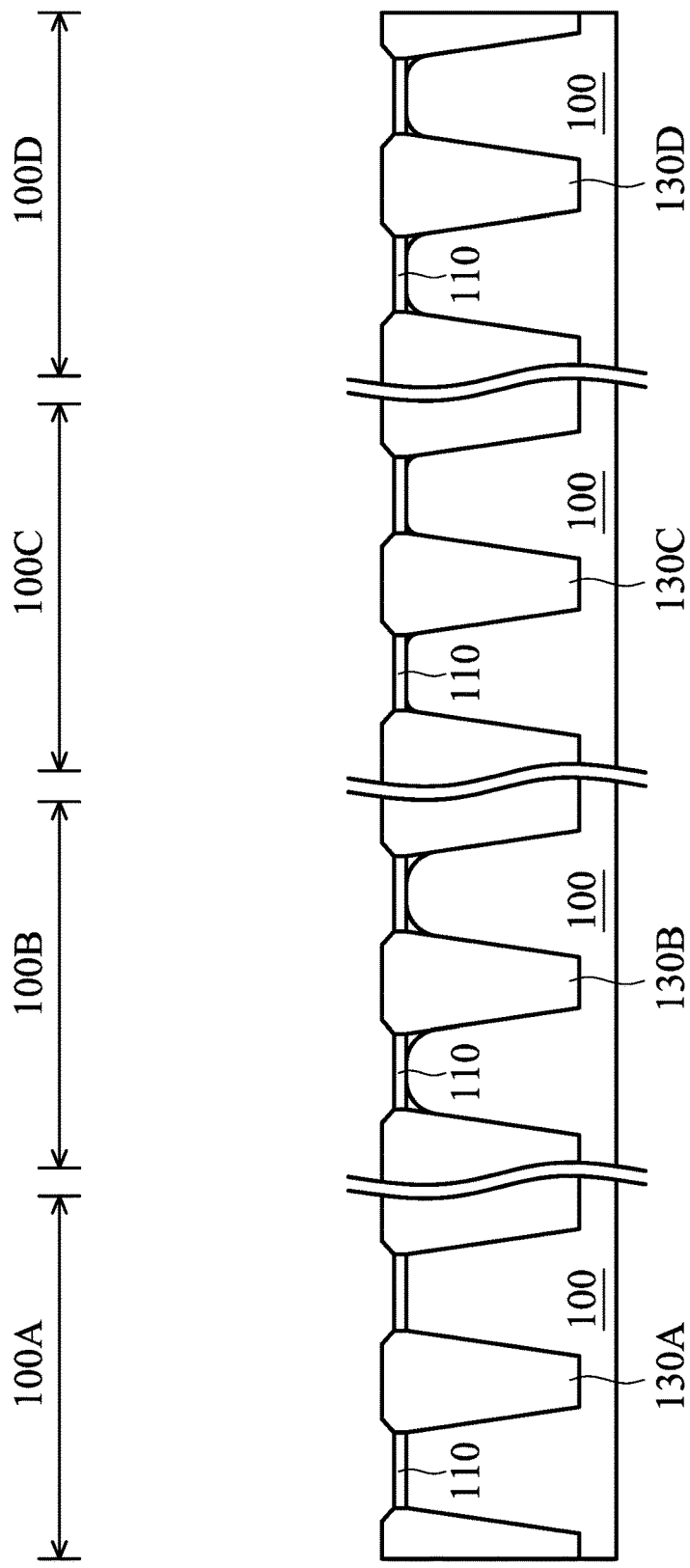

In some embodiments, as shown in FIG. 2E, the cap layer 140, the first remaining portion 140C, the second remaining portion 140D and the first dielectric layer 120 are removed after the oxidation process 200 is performed. In some embodiments, the cap layer 140, the first remaining portion 140C the second remaining portion 140D and the first dielectric layer 120 are removed by performing an anisotropic etching process.

Figure 2F:
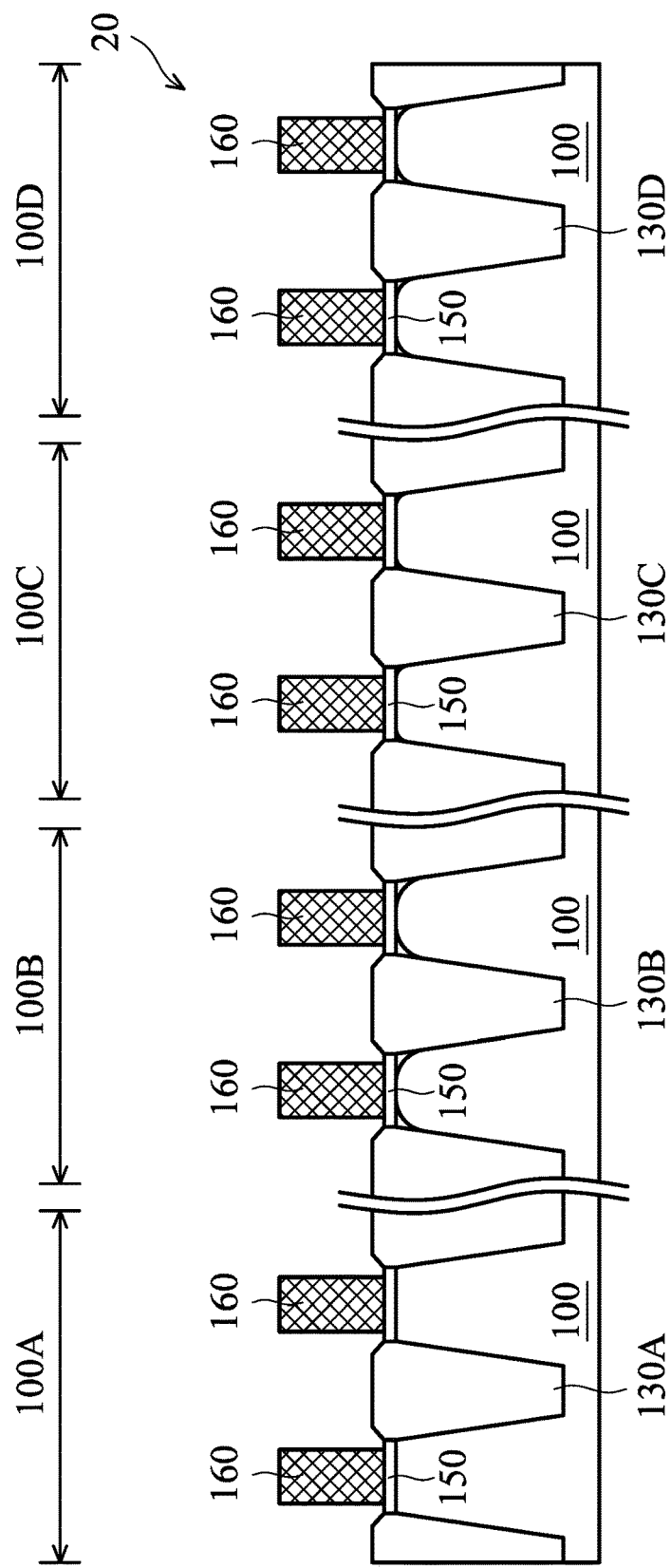

In some embodiments, as shown in FIG. 2F, the second dielectric layer 110 is removed after the cap layer 140, the first remaining portion 140C, the second remaining portion 140D and the first dielectric layer 120 are removed, and the gate oxide layer 150 is formed in two opposite sides of the first isolation structure 130A, two opposite sides of the second isolation structure 130B, two opposite sides of the third isolation structure 130C and two opposite sides of the fourth isolation structure 130D. The second dielectric layer 110 may be removed by dry etching, wet etching and other etching methods. The gate electrode layer 160 is formed over the gate oxide layer 150 after the gate oxide layer 150 is formed, and a semiconductor device 20 is completed.

In this embodiment, due to the profiles of the isolation element in the second area 100B, third area 100C and fourth area 100D (e.g. the high-voltage areas) being changed s that they have the second curvature, the third curvature and the fourth curvature which are smaller than the first curvature of the first region 100A, the gate oxide thinning ratio of the semiconductor device 20 becomes better. Therefore, the GOI of the gate oxide layer 150 of the semiconductor device 20 is improved. The cap layer 140 remains at different lengths (e.g. the first remaining portion 140C and the second remaining portion 140D) over the first dielectric layer 120, and then oxide regions having different curvatures are formed under the second dielectric layer 110 and over the sidewalls of the second isolation structure 130B, the third isolation structure 130C and the fourth isolation structure 130D, respectively. Then the isolation elements in the first area 100A, the second area 100B, the third area 100C and the fourth area 100D have different curvatures. Accordingly, the electronic qualities of the high-voltage areas are improved without impacting the saturated drain current of the low-voltage area.

Although the curvature of the isolation structure of the disclosure is defined by the surface formed of the sidewall of the isolation structure 130A/130B/130C/130D and the bottom surface of the patterned isolation structure 190, the curvature may also be defined by the border between other materials and the isolation structure or by the profile of the isolation element.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming an isolation structure of a semiconductor device, comprising:
    forming a patterned dielectric structure in a first area and a second area of a substrate;
    forming a first isolation structure in the first area and forming a second isolation structure in the second area of the substrate, wherein a surface formed of a sidewall of the first isolation structure and a bottom surface of the patterned dielectric structure of the first area has a first curvature, and a surface formed of a sidewall of the second isolation structure and a bottom surface of the patterned dielectric structure of the second area has the first curvature;
    forming a cap layer over the first area and the second area of the substrate;
    performing an etching process to remove the cap layer of the second area completely; and
    performing an oxidation process on the second area to form a first oxide region over the sidewall of the second isolation structure and under the bottom surface of the patterned dielectric structure of the second area, and a surface of the first oxide region adjacent to the substrate has a second curvature.

2. The method as claimed in claim 1, wherein the first curvature is greater than the second curvature.

3. The method as claimed in claim 1, wherein the first area is a low-voltage area, and the second area is a high-voltage area.

4. The method as claimed in claim 1, wherein the patterned dielectric structure comprises a first dielectric layer and a second dielectric layer under the first dielectric layer, wherein the first dielectric layer is made of silicon nitride, and the second dielectric layer is made of silicon oxide.

5. The method as claimed in claim 1, further comprising:
    forming the patterned dielectric structure in a third area and a fourth area of the substrate;
    forming a third isolation structure in the third area and forming a fourth isolation structure in the fourth area of the substrate, wherein a surface formed of a sidewall of the third isolation structure and a bottom surface of the patterned dielectric structure of the third area has the first curvature, and a surface formed of a sidewall of the fourth isolation structure and a bottom surface of the patterned dielectric structure of the fourth area has the first curvature; and
    performing the oxidation process on the third area and the fourth area to form a second oxide region over the sidewall of the third isolation structure and under the bottom surface of the patterned dielectric structure of the third area and a third oxide region over the sidewall of the fourth isolation structure and under the bottom surface of the patterned dielectric structure of the fourth area, wherein the second oxide region has a third curvature in the third area and the third oxide region has a fourth curvature in the fourth area.

6. The method as claimed in claim 5, further comprising:
    forming the cap layer over the third area and the fourth area of the substrate; and
    removing a portion of the cap layer in the third area and the fourth area such that the cap layer in the third area has a first remaining portion over the patterned dielectric structure, and the cap layer in the fourth area has a second remaining portion over the patterned dielectric structure, wherein a length of the first remaining portion is greater than a length of the second remaining portion.

7. The method as claimed in claim 5, wherein the third area and the fourth area are high-voltage areas.

8. The method as claimed in claim 6, wherein the first remaining portion extends from a top surface of the patterned dielectric structure of the third area to a top surface of the third isolation structure, and a portion of the patterned dielectric structure of the fourth area is not covered by the second remaining portion.

9. The method as claimed in claim 8, wherein the first curvature is greater than the third curvature, the third curvature is greater than the fourth curvature and the fourth curvature is greater than the second curvature.

10. The method as claimed in claim 9, further comprising:
    removing the cap layer of the first area and the patterned dielectric structure of the first area and the second area after performing the oxidation process.

11. The method as claimed in claim 1, wherein the etching process comprises an anisotropic etching process.

12. The method as claimed in claim 1, wherein the cap layer is made of silicon nitride.

13. The method as claimed in claim 1, wherein a thickness of the cap layer is in a range between 100 Å to 500 Å.

* * * * *